United States Patent
Chiang

[19]

[11] Patent Number: 6,020,820
[45] Date of Patent: Feb. 1, 2000

[54] CPU OVER-HEAT PROTECTION DETECTION DEVICE

[75] Inventor: Yung-Hwa Chiang, Taipei, Taiwan

[73] Assignee: Micro-Star International Co., Ltd., Taiwan

[21] Appl. No.: 08/959,505

[22] Filed: Oct. 28, 1997

[51] Int. Cl.[7] .................................................. G08B 17/00
[52] U.S. Cl. ........................ 340/584; 340/653; 361/697
[58] Field of Search ................................. 340/584, 595, 340/653; 374/183, 185, 208; 361/103, 106, 695, 697, 709, 687; 165/80.3

[56] References Cited

U.S. PATENT DOCUMENTS

| | | | |
|---|---|---|---|
| 5,482,793 | 1/1996 | Burns et al. | 429/62 |
| 5,612,677 | 3/1997 | Baudry | 340/584 |
| 5,712,762 | 1/1998 | Webb | 361/687 |
| 5,713,030 | 1/1998 | Evoy | 340/584 X |
| 5,714,938 | 2/1998 | Schwabl | 340/584 |

*Primary Examiner*—Thomas Mullen
*Attorney, Agent, or Firm*—Proskauer Rose LLP

[57] ABSTRACT

Disclosed is a CPU over-heat protection detection device in which a slot is formed on one side of a CPU heatsink, and a printed circuit board is placed into the slot. On the lower surface of the printed circuit board is mounted a sensor which detects and measures the surface temperature of the CPU, and converts the temperature value into a data signal which is transmitted to system chip of mother board via a wire so as to determine whether the measured temperature is beyond a preset value. If an over-heat state occurs, through the control of system chip, either the CPU temperature is decreased or a warning device starts to run in order to protect the CPU from burning down due to over-heat.

4 Claims, 3 Drawing Sheets

CPU OVER-HEAT PROTECTION DETECTION DEVICE

FIELD OF THE INVENTION

This invention relates to a CPU over-heat protection detection device, particularly to a device in which a sensor is disposed between one side of a heatsink that is mounted on a CPU and the CPU so as to detect and measure the surface temperature of the CPU in order to take action to decrease the temperature of the CPU.

BACKGROUND OF THE INVENTION

As the working frequency of CPU increases, the heat generated by the CPU grows. The CPU for personal computer has evolved from early Intel 80386, 80486 to present Pentium Pro 200, Pentium II, etc. The faster the working frequency of the CPU, the more heat that is generated by the CPU during operation. In order to prevent the CPU from burning up due to over-heat, the heat generated by the CPU must be dissipated suitably to maintain the working temperature in a range so as to retain the thermal stability and life of the CPU. A simple,cheap,convenient method of dissipating the heat of the CPU is to mount a heatsink on the surface of the CPU to dissipate the heat thereof. In order to increase the speed of heat dissipation, a plurality of fins are formed on the heatsink. Several wave-like folds are disposed on the fins to increase the surface area of the heatsink in heat transfer. However, if a heatsink is mounted on the CPU only, the heat dissipation speed is so low that the heat generated by the CPU cannot be dissipated instantly. Preferably, a fan is mounted on the heatsink in order to increase the heat dissipation rate. The mother board on which the CPU is mounted is encapsulated into the closed space of computer housing. If the housing is not dismantled, the user cannot know the state of heat dissipation of CPU from the outside of the housing. According to the experimental results, the life of a typical fan is about one year, and the life of CPU is about three years. In other words, the fan could break down during the normal utilization of CPU. After the fan breaks down, the user does not know this situation at all unless the user dismantles the housing. Thus, the temperature of CPU abruptly increases and the CPU burns up.

Many mother board manufacturers have proposed several methods of solving the above problem. For example, Taiwanese Patent Publication No. 283505 discloses a CPU temperature warning device for computer in which a detector is placed on the mother board at a corresponding location with respect to CPU. The detector is arranged under the CPU. The rotation speed of a fan is changed depending on the decrease or increase of temperature of CPU by means of a fan speed control circuit. Most portions are placed under the CPU, and a sensor directly measures the CPU temperature to control the fan speed. However, present CPUs are high speed calculation CPUs such as Pentium II. This species of CPU is mounted on the mother board in a vertical. Therefore, the CPU temperature warning device is not suitable for application to the new high speed calculation CPU, and will be completely rendered inadequate by new technology. When the fan breaks down so that it cannot run normally, the warning device can not function well. Therefore, the design of the Taiwanese patent does not meet the requirements of practical use.

SUMMARY OF THE INVENTION

It is an object of the present invention to provide an over-heat protection detection device in which at one side of the heatsink is formed a slot into which a printed circuit board is inserted. On the lower surface of the printed circuit board is a sensor which detects and measures the surface temperature of CPU, and the printed circuit board converts the temperature so measured into data signal which is transmitted to system chip of mother board via a wire so as to determine whether the measured temperature is beyond a preset value. If an over-heat state occurs,i.e. the measured temperature is higher than the preset value, means for decreasing the CPU temperature or warning means starts to run in order to protect the CPU from burning up due to over-heat.

The means for decreasing the CPU temperature of the present invention is to put CPU, a partial working state by the control of system chip, or to decrease working frequency of CPU so as to put CPU in low speed calculation state and to lower the CPU temperature. In the meantime, the warning means are driven to warn the user.

BRIEF DESCRIPTION OF THE INVENTION

DETAILED DESCRIPTION OF THE INVENTION

In the past, a CPU 10 was horizontally inserted into a ZIF socket. Thereafter, a design change occurred and the CPU 10 was inserted vertically into the ZIF socket, such that the production of the motherboard assembly simplified to a modular configuration. However, since this kind of CPU is quite expensive, the insertion of CPU into ZIF socket is mainly the horizontal type now. In one embodiment of the present invention, the insertion will be explained based on horizontal type of insertion into ZIF socket.

Figure 1:
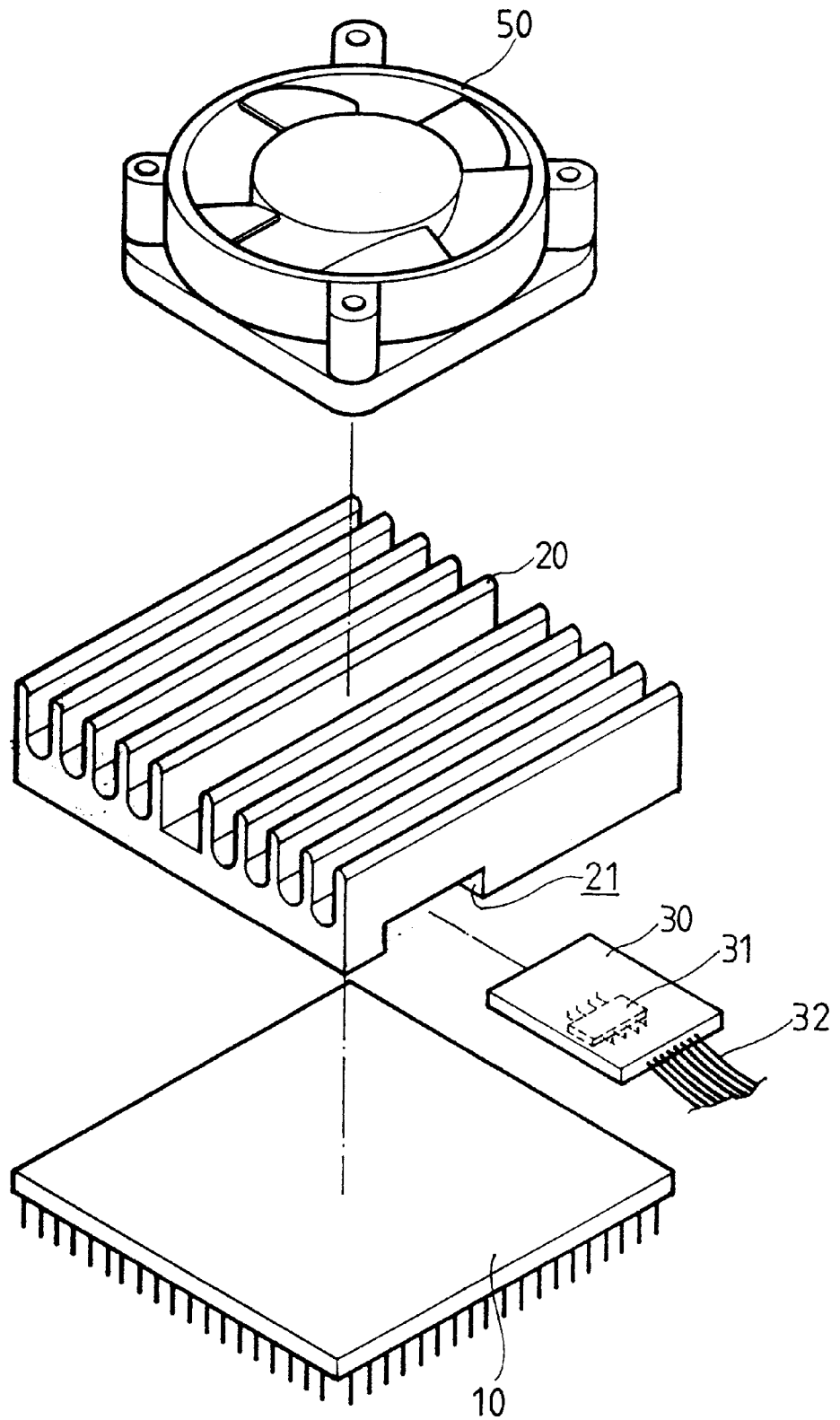
FIG. 1 is an exploded view of the device of the present invention.
Figure 2:
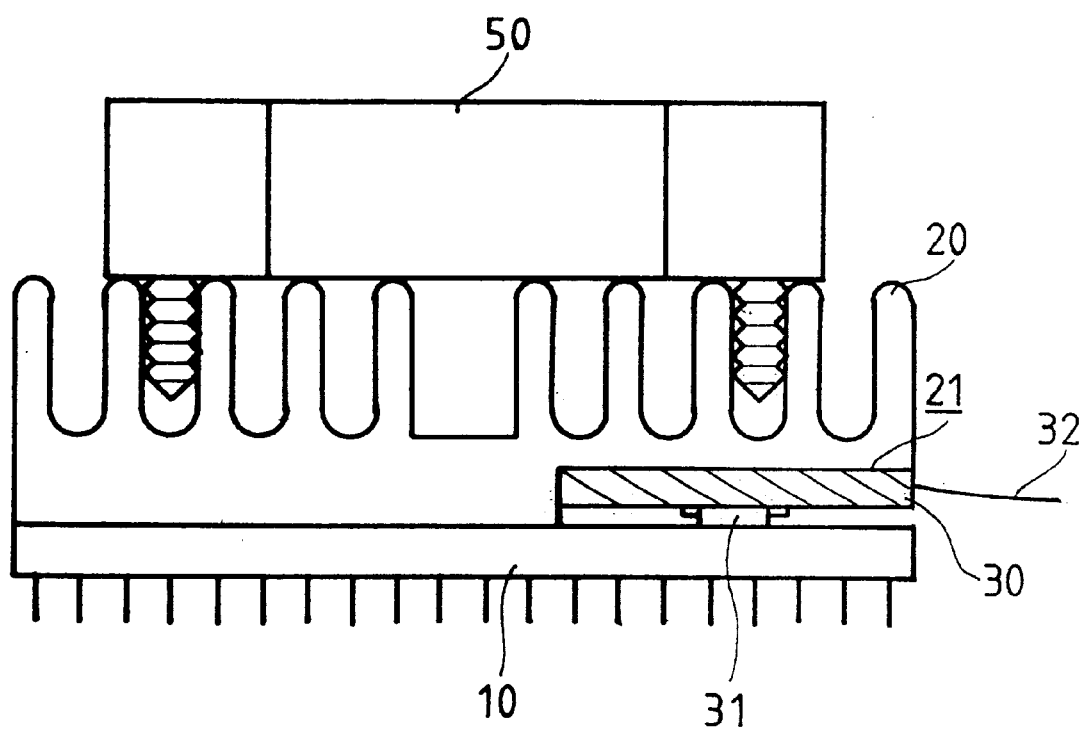
FIG. 2 is a cross-sectional view of the device of the present invention.
Figure 3:
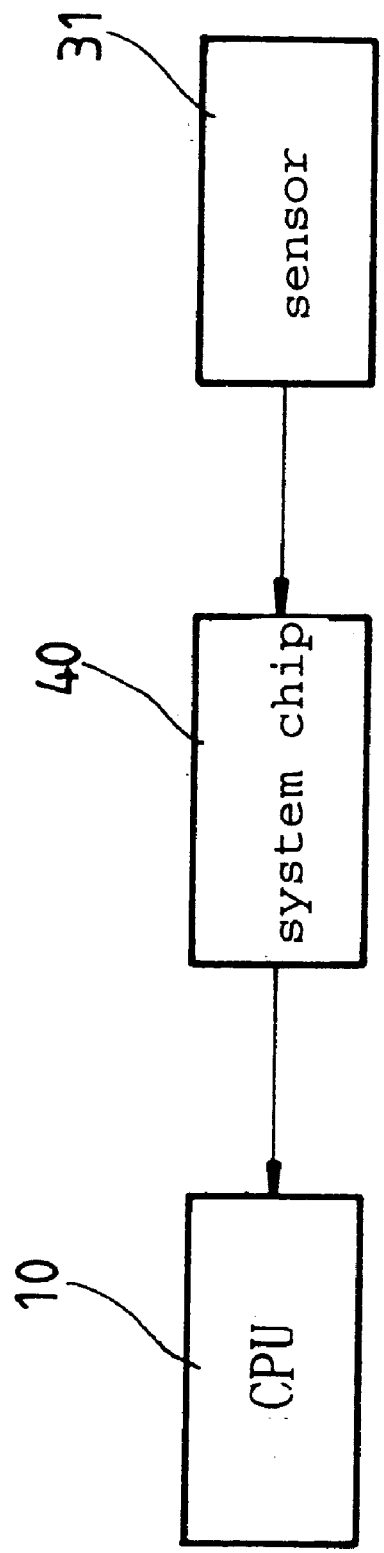
FIG. 3 is block diagram of the circuit of the present invention.

Please see FIG. 1. In the present invention, a slot 21 is formed on one side of heatsink 20. At the upper end of heatsink 20 is a fan 50 for assisting in heat dissipation. A printed circuit board 30 is placed into the slot 21. On the lower surface of the printed circuit board 30 is a sensor 31 as shown in FIG. 2. After the printed circuit board 30 is inserted into slot 21, the sensor 31 is in close contact with the surface of CPU 10 to detect the surface temperature of CPU 10. The detected temperature value is converted into data signal by the printed circuit board 30, and transmitted to the system chip 40 on the mother board via the wire 32 to determine whether the detected temperature is beyond the pre-set temperature value.

The temperature upper limits of various CPUs 10 made by many manufacturers differ from each other because they use different technology. Therefore, the computer should be informed at what temperature value the CPU 10 is in over-heat state. The method of informing in the present invention is to set up a temperature database or a look-up table in the system firmware(BIOS) in which the safe temperature value for each kind of CPU is set up. After the measured temperature obtained from sensor 31 is compared with the safe temperature value, if the measured temperature is higher than the safe temperature value, the CPU is in over-heat state, the means for decreasing the CPU temperature should be used immediately.

The sensor 31 can be a thermal resistor from which the measured temperature signal is converted into a digital signal by a circuit means mounted on printed circuit board 30 which received the output of sensor 31, such circuit means being any well known means in the art for converting a temperature signal to a digital signal. Then, via the wire 32 the digital signal is transmitted to system chip 40 on the mother board. The system chip 40 has the function of serial bus interface(in the present invention, I C is used). By the transmission of serial bus, the measured temperature data is transmitted to CPU 10 in which the measured temperature is compared with the preset value. If the measured temperature is higher than the preset value, the protection means for decreasing the CPU temperature are actuated. For example, under the control of system chip 40, the CPU is allowed to run in a partial work state. Alternatively, the working frequency of CPU 10 is lowered to allow the CPU to run in a low speed calculation state, whereby the heat generated in CPU is lowered and the CPU temperature decreases to a safe working temperature and the warning device 41 is simultaneously driven to notify the user.

Having shown and described a preferred embodiment of the present invention by way of example, it should be realized that structural changes could be made and other examples given without departing from either the spirit or scope of this invention.

We claim:

1. A CPU over-heat protection detection device adapted to be used in a CPU having a heatsink mounted on a surface thereof, the device comprising a slot formed on one side of the heatsink that faces the CPU, a printed circuit board being received into the slot with a sensor mounted on a lower surface of the printed circuit board to be in close contact with the surface of the CPU in order to detect surface temperature of the CPU, wherein the detected temperature value is converted into a data signal by the printed circuit board, and transmitted to a system chip on a mother board on which the CPU is mounted via wires to determine whether the detected temperature is beyond a pre-set temperature value and to actuate means for decreasing the CPU temperature.

2. The CPU over-heat protection detection device as claimed in claim 1 wherein the means for decreasing the CPU temperature prohibits the CPU from running in a complete work state under the control of the system chip.

3. The CPU over-heat protection detection device as claimed in claim 1 wherein the means for decreasing the CPU temperature decreases the working frequency of the CPU, making the CPU run in a low speed calculation state to reduce the heat generated in the CPU.

4. The CPU over-heat protection detection device as claimed in claim 1 wherein, when the means for decreasing the CPU temperature is actuated, a warning device is simultaneously driven to notify the user.

* * * * *